(12) United States Patent
Zhang et al.

(10) Patent No.: US 11,834,755 B2
(45) Date of Patent: Dec. 5, 2023

(54) LITHIUM NIOBATE HAVING P-TYPE NANOWIRE REGION OR N-TYPE NANOWIRE REGION, METHOD FOR PREPARING THE SAME, AND METHOD FOR CONVERTING CHARGE CARRIER TYPE OF NANOWIRE REGION

(71) Applicant: NANKAI UNIVERSITY, Tianjin (CN)

(72) Inventors: Guo-Quan Zhang, Tianjin (CN); Xiao-Jie Wang, Tianjin (CN); Yue-Jian Jiao, Tianjin (CN); Fang Bo, Tianjin (CN); Jing-Jun Xu, Tianjin (CN)

(73) Assignee: NANKAI UNIVERSITY, Tianjin (CN)

( * ) Notice: Subject to any disclaimer, the term of this patent is extended or adjusted under 35 U.S.C. 154(b) by 332 days.

(21) Appl. No.: 17/239,598

(22) Filed: Apr. 25, 2021

(65) Prior Publication Data

US 2021/0238767 A1 Aug. 5, 2021

Related U.S. Application Data

(63) Continuation of application No. PCT/CN2020/091167, filed on May 20, 2020.

(30) Foreign Application Priority Data

Sep. 20, 2019 (CN) .......................... 201910894519.1

(51) Int. Cl.
  *C30B 33/02* (2006.01)
  *C30B 29/30* (2006.01)
  (Continued)

(52) U.S. Cl.
  CPC .............. *C30B 29/30* (2013.01); *C30B 29/60* (2013.01); *C30B 33/02* (2013.01); *C30B 33/04* (2013.01); *B82Y 30/00* (2013.01); *B82Y 40/00* (2013.01)

(58) Field of Classification Search
  CPC ......... C30B 29/30; C30B 29/60; C30B 33/02; B82Y 30/00; B82Y 40/00
  See application file for complete search history.

(56) References Cited

U.S. PATENT DOCUMENTS

2004/0192040 A1\* 9/2004 Peng ...................... G02F 1/3558
                                                438/689
2006/0291519 A1\* 12/2006 Buse ....................... C30B 15/00
                                                372/68
(Continued)

FOREIGN PATENT DOCUMENTS

CN       104793287       7/2015
CN       106283194       1/2017
(Continued)

OTHER PUBLICATIONS

Grilli et al, "Investigation on reversed domain structures in lithium niobate crystals patterned by interference lithography " Feb. 24, 2003 / vol. 11, No. 4 / Optics Express 400.\*
(Continued)

*Primary Examiner* — Robert M Kunemund

(57) ABSTRACT

The present application provides a lithium niobate having a p-type nanowire region or an n-type nanowire region and a method for preparing the same. The method includes heating and then cooling a multi-domain lithium niobate crystal to confine hydrogen ions of the multi-domain lithium niobate crystal in domain wall regions; and poling the multi-domain lithium niobate crystal that has been heated by applying a voltage, to reverse a direction of polarization of one or more domains of the multi-domain lithium niobate crystal. The lithium niobate includes a lithium niobate crystal and a p-type nanowire region or an n-type nanowire region located in the lithium niobate crystal and adjacent to a surface of the lithium niobate crystal. The present application also provides a method for converting the charge carrier type of the lithium niobate nanowire region.

18 Claims, 9 Drawing Sheets

(51) Int. Cl.
*C30B 29/60* (2006.01)
*C30B 33/04* (2006.01)
*B82Y 30/00* (2011.01)
*B82Y 40/00* (2011.01)

(56) References Cited

U.S. PATENT DOCUMENTS

2010/0067087 A1* 3/2010 Buse ............... C30B 33/02
359/245
2015/0109160 A1* 4/2015 Hsu ................. H03M 1/12
341/158

FOREIGN PATENT DOCUMENTS

| | | |
|---|---|---|
| CN | 106283194 B | 7/2018 |
| CN | 108560060 | 9/2018 |
| CN | 110670134 | 1/2020 |
| WO | 2015088371 | 6/2015 |

OTHER PUBLICATIONS

Grange Rachel et al: "Lithium niobate nanowires synthesis, optical properties, an manipulation", Applied Physics Letters, American Institute of Physics, 2 Huntington Quadrangle, Melville, NY 11747, vol. 95, No. 14, Oct. 6, 2009, pp. 143105-143105.

Tian Tian et al.: "Fabrication and formation mechanism of p-type lithium niobate crystals by molybdenum doping and polarization", Journal of Materials Science: Materials in Elecctronics, Chapman and Hall, London, GB, vol. 27, No. 6, Feb. 12, 2016, pp. 5886-5894.

Gupta Manoj Kumar et al: "Highly efficient flexible piezoelectric nanogenerator and femtosecond two-photon absorption properties of nonlinear lithium niobate nanowires", Journal of Applied Physics, American Institute of Physics, 2 Huntington Quadrangle, Melville, NY 11747, vol. 121, No. 17, May 3, 2017, pp. 175103-2, col. 1, line 19-line 37; figures 3-4.

Extended European Search Report for European Application No. 20865642.1 dated Sep. 19, 2022 (8 pages).

International Search Report of PCT/CN2020/091167.

* cited by examiner

LITHIUM NIOBATE HAVING P-TYPE NANOWIRE REGION OR N-TYPE NANOWIRE REGION, METHOD FOR PREPARING THE SAME, AND METHOD FOR CONVERTING CHARGE CARRIER TYPE OF NANOWIRE REGION

CROSS-REFERENCE TO RELATED APPLICATIONS

This application claims priority to China Patent Application No. 201910894519.1, filed on Sep. 20, 2019, entitled, "Method for Preparing P-Type and N-Type Conducting Lithium Niobate Nanowires", the content of which is hereby incorporated by reference in its entirety. This application is a continuation under 35 U.S.C. § 120 of international patent application PCT/CN2020/091167, filed on May 20, 2020, the content of which is also hereby incorporated by reference in its entirety.

TECHNICAL FIELD

The present application belongs to the field of electrical conductance control of lithium niobate materials, and particularly relates to a lithium niobate crystal having a p-type nanowire region or an n-type nanowire region, a method for preparing the same, and a method for converting a charge carrier type of the nanowire region.

BACKGROUND

Lithium niobate crystal ($LiNbO_3$) is an important optical material, having various applications in the fields of integrated optics, nonlinear optics, and optoelectronic components. Lithium niobate is called as "silicon of photonics" and is one of the most promising optical materials. Lithium niobate is a kind of wide-bandgap material (with a band gap of about 4.0 eV at room temperature). The electrical conductivity of unreduced or nominally pure lithium niobate crystal, in general, ranges from $10^{-16}$ to $10^{-18}$ $\Omega^{-1}cm^{-1}$ at room temperature or at near room temperature. Limited by the wide band gap, the low electrical conductivity and the absence of stable p-type conduction, the lithium niobate crystal has not been shown to have any applications in electricity, and its applications in active devices are therefore limited. Doping is currently the most effective way to control electrical properties of lithium niobate crystals, such as a magnesium-doped or iron-doped lithium niobate crystal. However, a small amount of dopant cannot significantly enhance the electrical conductive behavior of lithium niobate crystals, whereas a lithium niobate crystal doped with a large amount of dopant is difficult to grow. More importantly, preparation of a stable p-type lithium niobate crystal has not yet been achieved. This bottleneck greatly limits the proposed active devices based on lithium niobate.

SUMMARY

In view of this, there is a demand to provide a lithium niobate crystal having a p-type nanowire region or an n-type nanowire region, a method for preparing the same, and a method for converting a charge carrier type of the nanowire region.

A method for preparing a lithium niobate crystal having a p-type nanowire region or an n-type nanowire region includes:

heating and then cooling a multi-domain lithium niobate crystal to confine hydrogen ions in domain wall regions of the multi-domain lithium niobate crystal;

poling the multi-domain lithium niobate crystal by applying a voltage to the multi-domain lithium niobate crystal that has been heated to reverse the direction of polarization of one or more domains of the multi-domain lithium niobate crystal, thereby forming the p-type nanowire region or the n-type nanowire region.

A lithium niobate crystal has a p-type nanowire region or an n-type nanowire region, wherein the p-type nanowire region or the n-type nanowire region is located in the lithium niobate crystal and adjacent to a surface of the lithium niobate crystal.

A method for converting the charge carrier type of a lithium niobate nanowire region includes:

re-poling the lithium niobate crystal having the p-type nanowire region or the n-type nanowire region by applying a voltage to the lithium niobate crystal to reverse the direction of polarization of the nanowire region, thereby converting the electrical conduction type of the nanowire region.

The details of one or more embodiments of the present application are set forth in the following drawings and description. Other features, objects, and advantages of the present application will be apparent from the description and drawings, and from the claims.

BRIEF DESCRIPTION OF THE DRAWINGS

In order to illustrate the embodiments of the present application more clearly, the drawings used in the embodiments will be described briefly. Apparently, the following described drawings are merely for the embodiments of the present application, and other drawings can be derived by those of ordinary skill in the art without any creative effort.

FIG. 13A and FIG. 13B show the characteristics of electrical conductance of the p-type and n-type nanowire regions prepared in an embodiment of the present application, wherein FIG. 13A shows steady-state I-V curves of the nanowire regions, and FIG. 13B shows characteristic conductivity decay curves of the nanowire regions.

DETAILED DESCRIPTION

The present disclosure will now be described in detail with reference to the accompanying drawings and embodiments in order to make the objects, technical solutions, and advantages of the present disclosure more clear. It should be understood that the specific embodiments described herein are only for explaining the disclosure, and not intended to limit the present disclosure.

Doping can introduce energy levels of a dopant into lithium niobate crystal, thereby increasing the dark conductivity, photoconductivity, and photovoltaic current of the doped lithium niobate crystal. A multi-domain ferroelectric material has a plurality of domain regions (also called ferroelectric domains or domains). The interface region between two adjacent domains is called domain wall. The domain walls between the ferroelectric domains exhibit many excellent physical properties, e.g., the high electrical conductance, which is different from those of bulk domains. This, in recent years, makes people aware of the broad application prospects of the ferroelectric domain walls in new nanoelectronic devices. Lithium niobate is similar to other ferroelectric materials, and the electrical conductivity of the domain walls is higher than that of the bulk domain. In addition, the inventors have found through multiple experiments that the photoconductivity of the domain walls is greater than that of the ferroelectric domains in lithium niobate crystal under ultraviolet light irradiation. These new phenomena make it possible to prepare integrated nano-optoelectronic devices based on lithium niobate. However, no report has been found on the technology of controlling charge carrier transport in nano-scale in the lithium niobate crystal.

Figure 1:
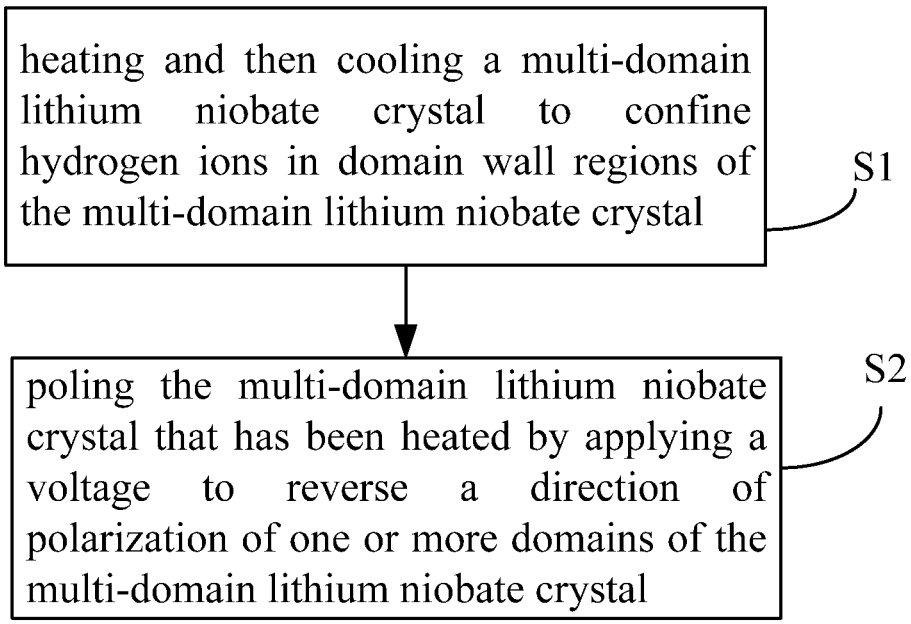
FIG. 1 is a flowchart of a method for preparing a lithium niobate crystal having a p-type or an n-type nanowire region according to an embodiment of the present application.

Referring to FIG. 1, the present application provides an embodiment of a method for preparing a lithium niobate crystal having a p-type nanowire region or an n-type nanowire region, including steps S1 and S2.

Step S1 is a heat treatment of a multi-domain lithium niobate crystal, which specifically includes heating the multi-domain lithium niobate crystal for a predetermined time period and cooling it to room temperature. The heat treatment causes the hydrogen ions in the multi-domain lithium niobate crystal to move to and be confined in the domain wall regions.

Step S2 is to pole the multi-domain lithium niobate crystal that has been heated. More specifically, the poling is by applying a voltage to the multi-domain lithium niobate crystal, and therefore to reverse the direction of polarization (also called a polarization direction) of one or more domains of the multi-domain lithium niobate crystal, thereby forming the p-type or n-type nanowire region (also called a p-type or n-type lithium niobate nanowire) at a position of the domain wall, and the position is adjacent to a surface of the lithium niobate crystal.

Figure 2:
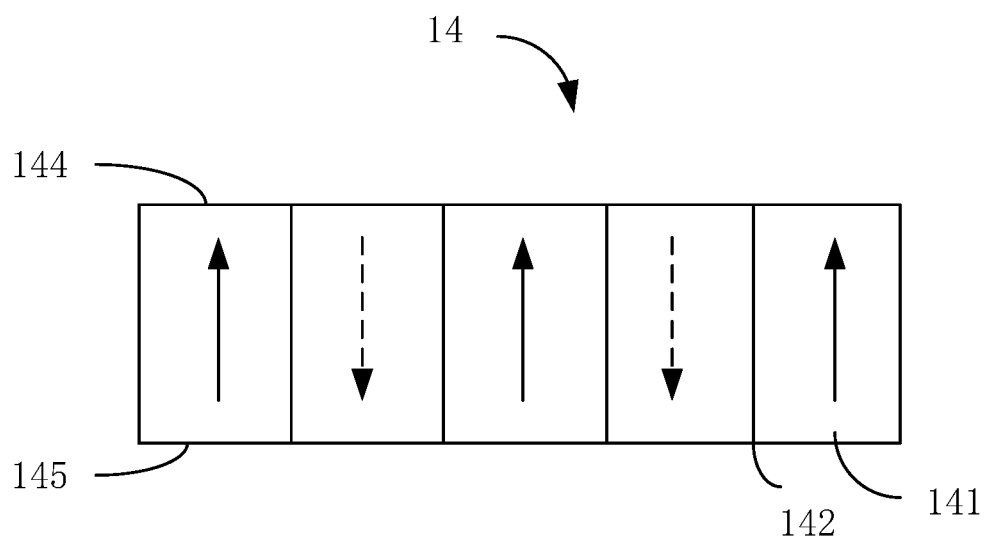
FIG. 2 is a schematic structural view of a pristine multi-domain lithium niobate crystal according to an embodiment of the present application.

Referring to FIG. 2, the pristine multi-domain lithium niobate crystal 14 that is to be heated and poled has multi-domains 141 and domain walls 142 located between the domains 141. The arrows shown in FIG. 2 represent the polarization directions of the ferroelectric domains 141. The positions and shapes of the domain walls 142 determine the positions and morphologies of the p-type or n-type nanowire regions in the lithium niobate crystal and can be selected according to an actual need of the product applied in an electrical device.

The lithium niobate crystal 14 can have a first surface 144 and a second surface 145 opposite to each other. Optionally, the domain wall 142 can extend inward from the first surface 144 or the second surface 145 of the lithium niobate crystal 14. It can be understood that although the domain walls 142 drawn in FIG. 2 are perpendicular to the first surface 144 and the second surface 145 of the lithium niobate crystal 14, the domain wall 142 actually is not perpendicular to the surfaces 144, 145 of the lithium niobate crystal 14. There is a small angle between the actual domain wall 142 and the polarization directions.

In an embodiment, the lithium niobate crystal 14 has a thickness direction perpendicular to the first and second surfaces 144, 145. The domain walls 142 of the lithium niobate crystal 14 can penetrate through the lithium niobate crystal 14 in the thickness direction. In an embodiment, the lithium niobate crystal 14 can have periodically poled ferroelectric domains 141, that is, the polarization directions of the plurality of domains 141 change periodically, e.g., along a direction parallel to the surfaces 144, 145 of the lithium niobate crystal 14. By applying electric fields to different regions of the lithium niobate crystal 14 and controlling the amplitude of electric fields and positions and shapes of electrodes, not only the periodically poled domains 141 can be formed, but also the positions and shapes of the domain walls 142 can be controlled. For example, the distances between the domain walls 142, and the lengths, depths, and extending directions of the domain walls 142 can be controlled. In an embodiment, the domain walls 142 are in the shape of straight lines in their length direction.

The polarization directions of the lithium niobate crystal 14 are along the z-axis of the crystal. In an embodiment, the multi-domain lithium niobate crystal is a z-cut lithium niobate; that is, the surface of the lithium niobate crystal is perpendicular to the direction z (i.e., the c-axis of the lithium niobate crystal). When the polarization direction of the lithium niobate crystal 14 points from the first surface 144 to the second surface 145, the first surface 144 is defined as the −z surface, and the second surface 145 is defined as the +z surface, and vice versa. The domain inversion of the z-cut lithium niobate achieved by the electric field poling is limited by a relatively high polarization reversal voltage (or electric field) of the crystal. In an embodiment, the z-cut lithium niobate has a thickness smaller than 1 millimeter, which is convenient to reverse the polarization direction at a relatively low voltage without an electrical breakdown.

The lithium niobate crystal can be a congruent lithium niobate crystal or a lithium niobate crystal doped with other elements, such as magnesium-doped lithium niobate or iron-doped lithium niobate. In addition, the lithium niobate crystal contains hydrogen ions ($H^+$, protons). In an embodiment, the number of the hydrogen ions per unit volume in the lithium niobate crystal is greater than or equal to $10^{18}$ $cm^{-3}$. It can be understood that, in normal circumstances, when using the Czochralski method to grow lithium niobate crystals, hydrogen ions from water in the environment will be inevitably introduced into the lithium niobate crystals during the growth and exist as defects, such as $OH^-$, in the lithium niobate crystals. Therefore, the existence of a small amount of hydrogen ions in lithium niobate crystals is an inherent property of lithium niobate crystals. The concentration of the inherent hydrogen ions can meet the above-described concentration requirement, that is to say, a lithium niobate crystal can be used without additional hydrogen doping. Of course, the concentration of hydrogen ions in the lithium niobate crystal can also be increased by an additional hydrogen doping step.

The heat treatment of the multi-domain lithium niobate crystal is to make the hydrogen ions (i.e., the protons) in the multi-domain lithium niobate crystal move to the domain walls and be confined in the domain walls by using a thermal fixing technique. More specifically, when the crystal is heated to above 90° C., the hydrogen ions in the lithium niobate crystal are activated. Under an action of an unbalanced electric field at the lithium niobate domain walls, the hydrogen ions move to the domain walls. Holding the temperature above 90° C. can make the hydrogen ions fully gather in the domain walls. Cooling the lithium niobate crystal whose hydrogen ions have been aggregated in the domain walls to below 90° C. can make the hydrogen ions immobile and therefore be confined in the domain walls. Due to the presence of the hydrogen ions, new defect structures are generated in the domain walls whose lattice structure is distorted, thereby reducing the magnitude of polarization vector and forming a special domain structure in this region.

In an embodiment, the multi-domain lithium niobate crystal is heated to a predetermined temperature, held at the predetermined temperature for a predetermined time period, and then naturally cooled down to room temperature. In an embodiment, the heating and cooling rates are both smaller than or equal to 5° C./min to prevent the crystal from being cracked due to uneven temperature distribution. The predetermined temperature is in a range from 90° C. to 180° C., and the temperature-holding period is in a range from 0.5 hours to 2 hours. In an embodiment, the heat treatment of the lithium niobate crystal is performed immediately after the periodically poled domain structure is formed and before the electron concentration at the domain walls decreases.

Figure 3:
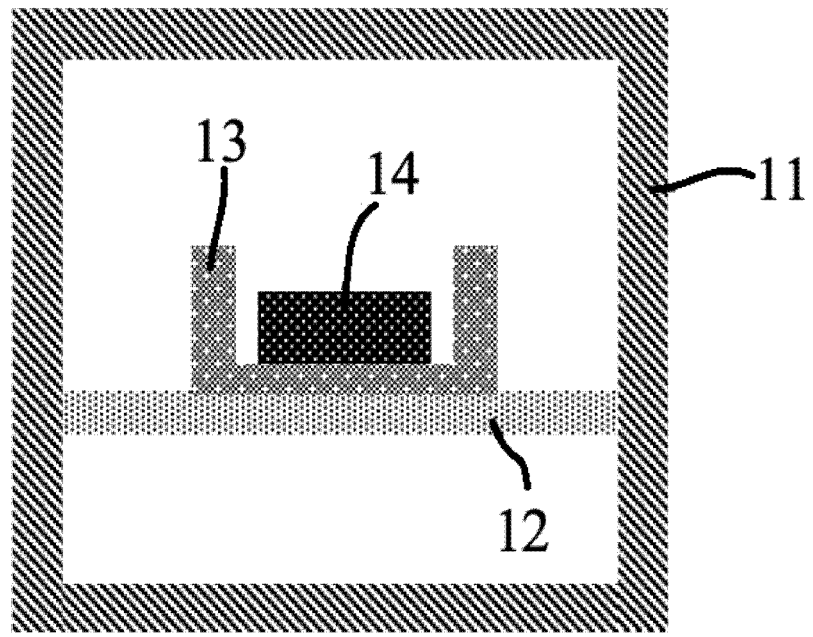
FIG. 3 is a schematic view of a thermal fixing apparatus according to an embodiment of the present application.

In an embodiment of step S1, the heat treatment is performed in a heating apparatus as shown in FIG. 3. Specifically, the multi-domain lithium niobate crystal 14 is placed in a quartz boat 13. The quartz boat 13 is a container with an opening on the top. The quartz boat 13 is placed on a holder 12 in a heating furnace 11. The heating furnace 11 has a sealed cavity. The atmosphere of the heat treatment can be air or inert gas to prevent oxidation or reduction of the lithium niobate.

Step S2 is performed after step S1, and specifically after the heat treatment and after the temperature of the lithium niobate crystal has decreased to below 90° C. (in an embodiment, after the temperature is decreased to room temperature). In step S2, the lithium niobate crystal can be poled by applying an electric field to the lithium niobate crystal through electrodes on the two opposite surfaces (i.e., the first surface 144 and the second surface 145) of the lithium niobate crystal. The electrodes can be solid electrodes, such as metal layers deposited on the surfaces of the lithium niobate crystal, or liquid electrodes, such as electrolyte liquid layers coated on the surfaces of the lithium niobate crystal.

Figure 4:
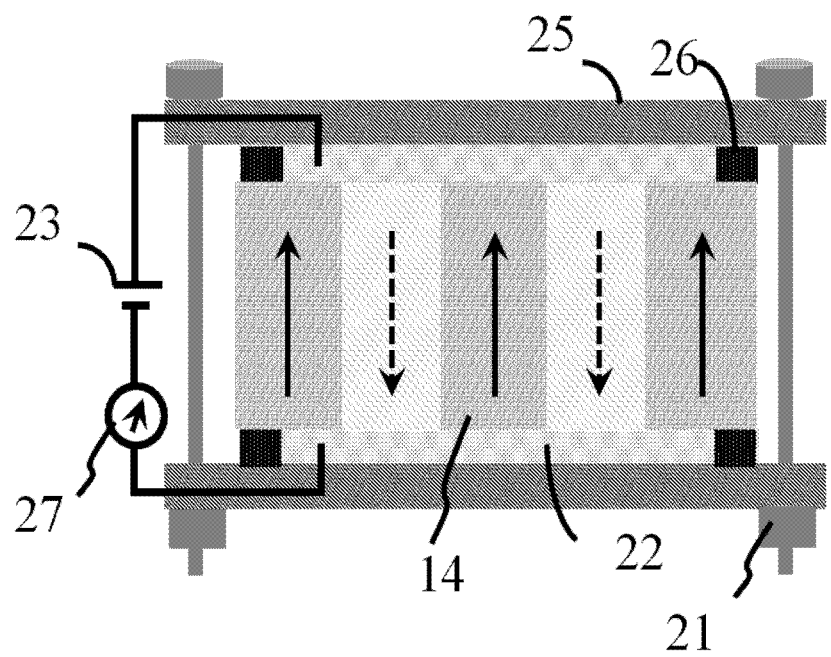
FIG. 4 is a schematic view of a poling setup according to an embodiment of the present application.

In an embodiment of step S2, the poling is performed by using a poling apparatus as shown in FIG. 4. Spacers 26 (e.g., silica gel pads) are respectively disposed on the first surface 144 and the second surface 145 of the lithium niobate crystal 14, which are further covered by insulating substrates 25 (e.g., organic glass plates). The insulating substrate 25 is fixed by four screws 21 at four positioning corners thereof. Electrolyte liquid is injected into the spaces between the insulating substrates 25 and the lithium niobate crystal 14 spaced by the spacers 26 and soaks the first surface 144 and the second surface 145 of the lithium niobate crystal 14, thereby forming the liquid electrodes 22. In an embodiment, the electrolyte liquid is a saturated LiCl solution.

In step S2, the voltage applied to the lithium niobate crystal is greater than or equal to the polarization reversal voltage and smaller than the breakdown voltage. It can be understood that the polarization reversal voltage of the lithium niobate crystal is dependent on the dopants and the growth of the crystal, and can be obtained through a polarization reversal experiment. In an embodiment, the polarization reversal voltage of a 5 mol %-magnesium-doped single-domain lithium niobate crystal grown by the Czochralski method is about 6.2 kV/mm. The polarization reversal voltage of a multi-domain lithium niobate can be reduced least to 1/10 of the polarization reversal voltage of the original single-domain lithium niobate. By applying the voltage to the lithium niobate crystal, the domains whose polarization direction is opposite to the direction of the external electric field is reversed in the lithium niobate crystal; that is, the polarization direction of these domains is reversed. Therefore, the direction of the externally applied electric field is determined by the original polarization direction of these domains whose polarization needs to be reversed, that is, the direction of the external electric field is opposite to the original polarization direction of these domains.

In an embodiment, a positive electrode of a high-voltage power source 23 is electrically connected to the first surface 144 of the lithium niobate crystal 14, and a negative electrode of the high-voltage power source 23 is electrically connected to the second surface 145 of the lithium niobate crystal 14, which can cause the polarization reversal in the domains 141 whose polarization direction originally points from the second surface 145 to the first surface 144, that is, can reverse the polarization direction of the domains 141 whose second surface 145 is the −z surface and whose first surface 144 is the +z surface. In another embodiment, the positive electrode of the high-voltage power source 23 is electrically connected to the second surface 145 of the lithium niobate crystal 14, and the negative electrode of the high-voltage power source 23 is electrically connected to the first surface 144 of the lithium niobate crystal 14, which can cause the polarization reversal in the domains 141 whose polarization direction originally points from the first surface 144 to the second surface 145, that is, can reverse the polarization direction of the domains 141 whose first surface 144 is the −z surface and whose second surface 145 is the +z surface.

A current meter 27 is connected in the circuit between the high-voltage power source 23 and the lithium niobate crystal to measure a poling current. The directions indicated by the arrows in FIG. 4 are the polarization directions of the ferroelectric domains of the multi-domain lithium niobate crystal 14 before the voltage is applied in step S2.

Figure 5:
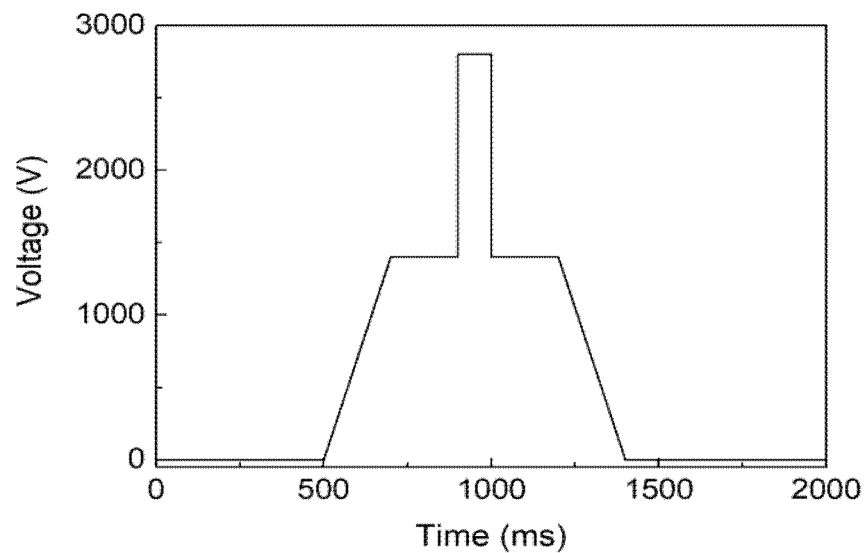
FIG. 5 is a voltage waveform diagram used in a poling process of an embodiment of the present application.

An embodiment of a poling voltage waveform is shown in FIG. 5. The output voltage of the high-voltage power source 23 changes with time and has a five-stage voltage waveform. The first stage is a voltage rising stage, during which the voltage increases with time but does not exceed the polarization reversal voltage that causes the polarization reversal of the ferroelectric domains of the lithium niobate crystal. The voltage gradually increases with time to avoid the crystal cracked. The second and fourth stages are voltage maintaining stages, during which the voltage remains constant and does not exceed the polarization reversal voltage. The third stage is a poling stage, during which the voltage is greater than or equal to the polarization reversal voltage and smaller than the breakdown voltage of the lithium niobate crystal, so that the ferroelectric domains whose polarization direction is opposite to the direction of the external electric field are reversed. In order to shorten the duration of the applied high voltage as much as possible to prevent the crystal from electrical breakdown due to a long period of applying the high voltage, the voltage jumps up when entering the third stage from the second stage and jumps down when entering the fourth stage from the third stage. During the fourth stage, the voltage remains constant to prevent the reversed ferroelectric domains from flip-back. The fifth stage is a voltage descending stage. In an embodiment, the polarization reversal voltage per unit thickness (i.e., the polarization reversal field) $E_c$ of the 5 mol %-magnesium-doped single-domain lithium niobate crystal is about 6.2 kV/mm, the breakdown voltage per unit thickness (i.e., the breakdown field) $E_b$ of the lithium niobate crystal is about 20.0 kV/mm. The polarization reversal field of the multi-domain lithium niobate crystal can be at least 1/10 of the polarization reversal field of the corresponding single-domain crystal, and thus the applied field in the third stage is greater than or equal to 1/10 of $E_c$ and smaller than $E_b$ for the multi-domain lithium niobate crystals. Generally, the larger the applied field, the shorter the required time period for the poling. The constant voltages of the second stage and the fourth stage can be, for example, in a range from 20% to 80% of the applied voltage in the third stage.

Figure 6:
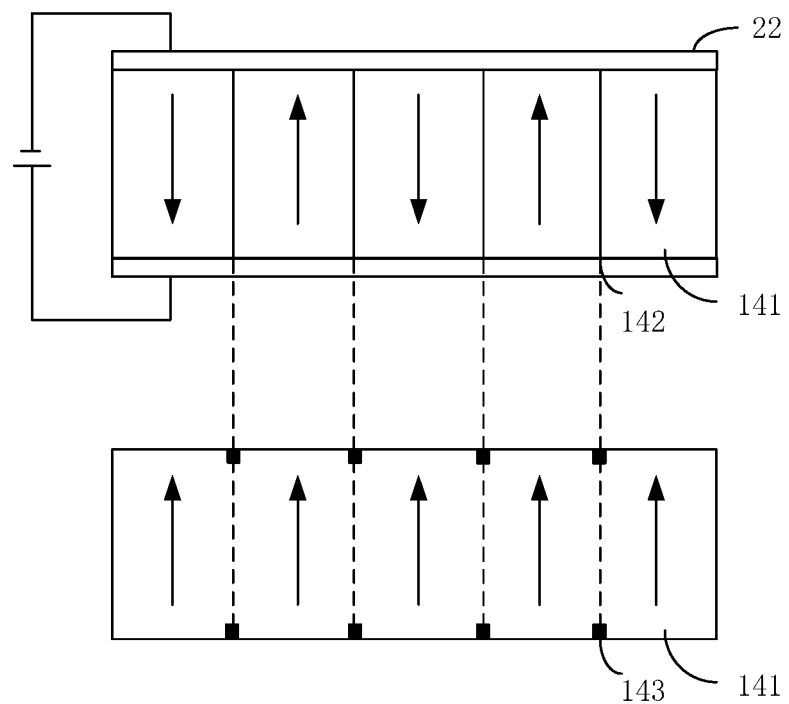
FIG. 6 is a schematic view comparing structures between a pristine lithium niobate crystal and a lithium niobate crystal having p-type and n-type nanowire regions according to an embodiment of the present application.
Figures 7A, 7B:
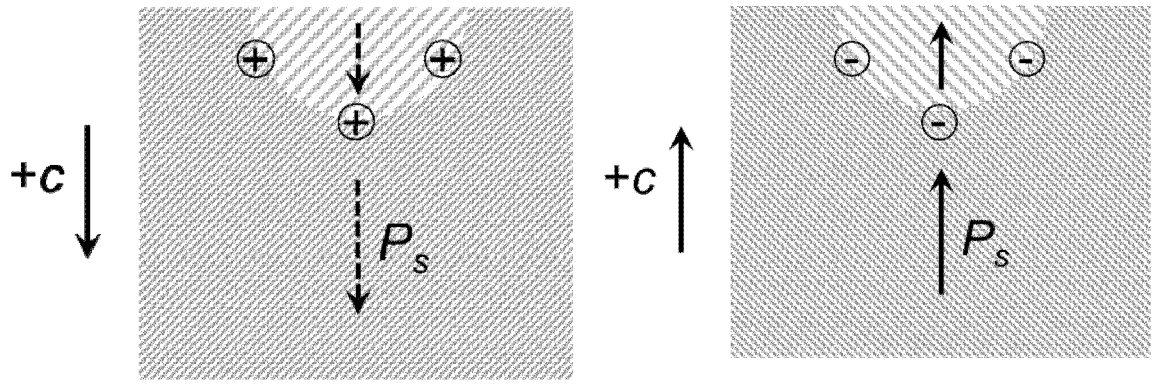
FIG. 7A is a schematic structural view of a local area of a lithium niobate crystal having a p-type nanowire region according to an embodiment of the present application.
FIG. 7B is a schematic structural view of a local area of a lithium niobate crystal having an n-type nanowire region according to an embodiment of the present application.
Figure 8:
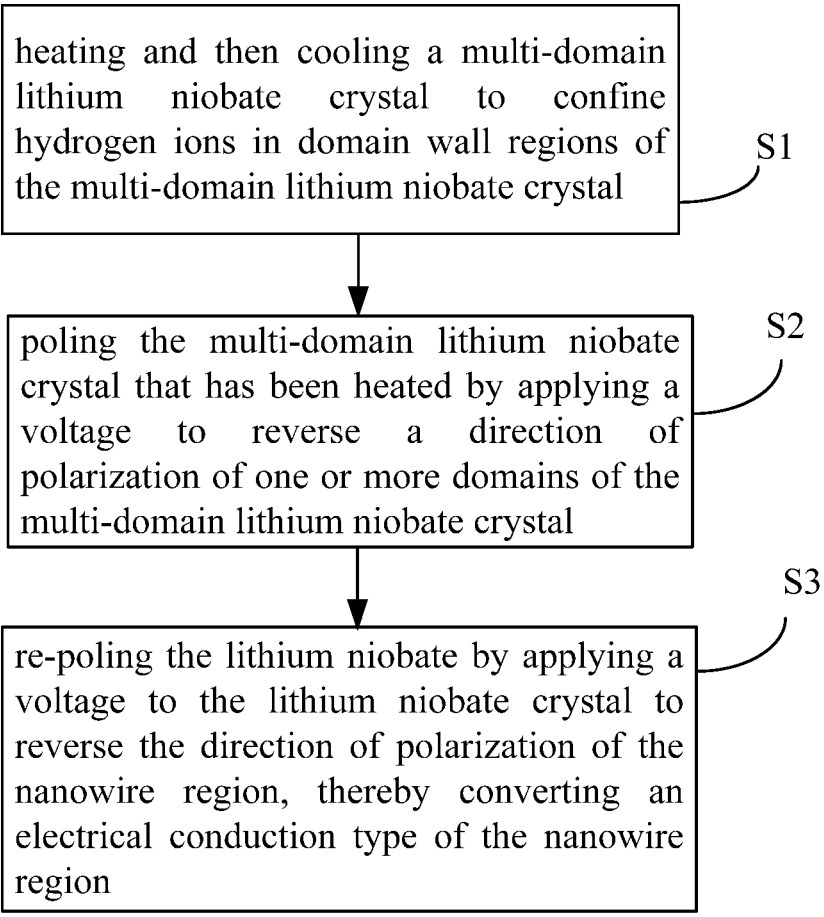
FIG. 8 is a flowchart of a method for converting the charge carrier type of a nanowire region according to an embodiment of the present application.

Referring to FIG. 6, the upper portion of FIG. 6 is the multi-domain lithium niobate crystal before the poling, and the lower portion is the lithium niobate crystal having the p-type and n-type nanowire regions after the poling. The directions indicated by the arrows are the polarization directions of the ferroelectric domains of the lithium niobate crystal. In step S2, the poling voltage is applied to the heat-treated multi-domain lithium niobate crystal 14, and the poling voltage can cause the polarization reversal in the domains 141 whose original polarization direction is opposite to the applied electric field. As a result, the polarization direction of the domains 141 in the lithium niobate crystal 14 is changed, the portion of the multi-domain lithium niobate crystal 14 that is subjected to the poling voltage has the same polarization direction, and the domain walls 142 disappear in the lithium niobate crystal. The inventors found that this process generates a difference in magnitude of polarization vector between the nanowire regions 143 and the bulk domain; the nanowire regions 143 are at the positions of the original domain walls and adjacent to the surfaces of the poled lithium niobate crystal 14. The magnitude of polarization vector (also called a polarization magnitude) of the nanowire regions 143 is smaller than the polarization magnitude of the bulk domain. According to the Gauss's law, net bound charges appear at the interfaces between regions with different polarization magnitudes. Specifically, referring to FIG. 7A and FIG. 7B, where the arrow +c represents the direction of the c-axis of lithium niobate, the direction of the arrow $P_s$ represents the polarization direction of the domain in the lithium niobate crystal, and the length of the arrow $P_s$ represents the polarization magnitude of the domain. The polarization is discontinuous at the interface between the bulk domain and the nanowire region 143 adjacent to the +z surface and at the interface between the bulk domain and the nanowire region 143 adjacent to the −z surface, according to which net bound charges at the interface can be positive or negative, respectively, and the free compensating charges are negative or positive, respectively. Therefore, the electrical conductance type of the nanowire region 143 is n-type or p-type on the +z surface or the −z surface, respectively. The type of the net bound charges is dependent on the polarization direction of the domains. When the polarization direction of the domains points from the nanowire region 143 to the bulk domain, the net bound charges at the interface are negative, and the compensating charges are positive (holes). When the polarization direction of the domains points from the bulk domain to the nanowire region 143, the net bound charges at the interface are positive, and the compensating charges are negative (electrons). In an embodiment, the polarization direction of the domains before the polarization reversal of the lithium niobate crystal 14 points from the second surface 145 to the first surface 144, and the polarization direction of the domains after the polarization reversal is from the first surface 144 to the second surface 145, then the compensating charges on side of the first surface 144 (the −z surface) are holes, forming a p-type nanowire region (as shown in FIG. 7A), and the compensating charges on the side of the second surface 145 (the +z surface) are electrons, forming an n-type nanowire region (as shown in FIG. 7B). In other words, by applying a poling voltage to the heat-treated multi-domain lithium niobate crystal 14 through step S2, nanowire regions having the opposite charge carrier types can be formed respectively on the two opposite surfaces (e.g., the +z surface and the −z surface) of the lithium niobate crystal 14 at the same time.

In an embodiment, step S2 can include applying electric fields in opposite directions onto different portions of the multi-domain lithium niobate crystal, so that the domains in different portions and adjacent to the same surface of the multi-domain lithium niobate crystal undergo polarization reversals in opposite directions, which can correspondingly and simultaneously form the p-type nanowire region and the n-type nanowire region adjacent to the same surface of the lithium niobate crystal.

It can be understood that when the thickness of the lithium niobate crystal is relatively large, and the domain wall does not penetrate through the thickness direction, the p-type or n-type nanowire region can be formed only on one surface at the position of the domain wall of the lithium niobate crystal.

The present application also provides an embodiment of lithium niobate, including a lithium niobate crystal and a p-type or n-type nanowire region located in the lithium niobate crystal and adjacent to a surface of the lithium niobate crystal. The lithium niobate can be prepared by the above-described method.

The lithium niobate crystal can have either or both of the p-type nanowire region and the n-type nanowire region. The p-type nanowire region and the n-type nanowire region can be respectively adjacent to the two opposite surfaces of the lithium niobate crystal, or both adjacent to a same surface of the lithium niobate crystal.

Optionally, the width of the nanowire region is tens of nanometers, for example, in a range from 10 nanometers to 100 nanometers; the longitudinal depth of the nanowire region is in a range from 1 micron to 5 microns, for example, about 2 microns; and the length of the nanowire region is not limited and is determined by the length of the domain wall that is existed in the pristine multi-domain lithium niobate crystal. The length direction of the domain wall is parallel to the surface of the lithium niobate crystal and can be selected according to actual needs. The longitudinal depth refers to the size of the nanowire region along the thickness direction of the lithium niobate crystal.

In some embodiments, the electrical conductivity of the p-type nanowire region is on the order of $10^{-7}$ $(\Omega\ cm)^{-1}$, that is, in a range from $1\times10^{-7}$ $(\Omega\ cm)^{-1}$ to $10\times10^{-7}$ $(\Omega\ cm)^{-1}$. The electrical conductivity of the n-type nanowire region is on the order of $10^{-6}$ $(\Omega\ cm)^{-1}$, that is, in a range from $1\times10^{-6}$ $(\Omega\ cm)^{-1}$ to $10\times10^{-6}$ $(\Omega\ cm)^{-1}$.

In an embodiment, the lithium niobate crystal is a z-cut lithium niobate crystal; that is, the cutting direction of the lithium niobate crystal is perpendicular to the c-axis of the crystal. In an embodiment, the thickness of the z-cut lithium niobate crystal is smaller than 1 millimeter.

The region of the lithium niobate crystal excluding the p-type and n-type nanowire regions can be called the bulk domain. In an embodiment, the p-type and/or n-type nanowire region has the same polarization direction as that of the nearby bulk domain, and the polarization magnitudes of the p-type and n-type nanowire regions are each smaller than the polarization magnitude of the bulk domain.

The present application also provides an embodiment of a method for converting the charge carrier type of a lithium niobate nanowire region, including:

S3, re-poling the lithium niobate having the p-type nanowire region and/or the n-type nanowire region. Specifically, the re-poling is applying a voltage to the lithium niobate crystal to reverse the polarization direction of the p-type and/or n-type nanowire region, thereby converting the charge carrier type of the nanowire region. That is, the p-type nanowire region is converted into an n-type nanowire region, and/or the n-type nanowire region is converted into a p-type nanowire region.

Step S3 is similar to step S2, and they are different only in that the polarity of the voltage applied in step S2 is reversed in step S3. That is, when the first surface 144 of the lithium niobate crystal is connected to the positive electrode of the power source, and the second surface 145 is connected to the negative electrode of the power source in step S2, then the first surface 144 of the lithium niobate crystal is connected to the negative electrode of the power source, and the second surface 145 is connected to the positive electrode of the power source in step S3; or vice versa. The waveform of the voltage applied in step S3 can adopt the voltage waveform in the embodiment of FIG. 5 in step S2. In another embodiment, the value of the poling voltage in step S3 is different from that in step S2; for example, the voltage waveform of the poling voltage in step S3 is different from that in step S2, as long as the value of the poling voltage is greater than or equal to that of the polarization reversal voltage of the multi-domain lithium niobate crystal and smaller than the breakdown voltage, and the direction of the external electric field is opposite to the polarization direction of the nanowire region whose electrical conductance type needs to be converted. By applying the electric field in the direction opposite to the current polarization direction to the lithium niobate in which the p-type and/or n-type nanowire region has already been formed and having the voltage greater than the polarization reversal voltage of the lithium niobate crystal, the polarization direction in the lithium niobate crystal can be reversed, and the charge carrier type of nanowire region can be converted as well. In an embodiment, in step S2, the p-type nanowire regions are formed adjacent to the first surface 144 of the lithium niobate crystal, and the n-type nanowire regions are formed adjacent to the second surface 145 of the lithium niobate crystal; then in step S3 the p-type nanowire region adjacent to the first surface 144 of the lithium niobate crystal is converted into an n-type nanowire region, and the n-type nanowire region adjacent to the second surface 145 of the lithium niobate crystal is converted into a p-type nanowire region.

It can be understood that during the poling in step S3, the charge carrier type of the nanowire region converts only when the direction of the applied electric field is opposite to the current polarization direction of the lithium niobate crystal. That is, through the second polarization reversal, the polarization direction of both the bulk domain and the nanowire region can be reversed, thereby converting the polarity of the net bound charges at the interface between the nanowire region and the bulk domain and changing the charge carrier type of the nanowire regions.

The lithium niobate having the p-type nanowire region or the n-type nanowire region, the method for preparing the same, and the method for converting the charge carrier type of the nanowire region provided in the present application make up for the shortcomings of the conventional lithium niobate crystal in the field of controlling charge carrier type and transport in nano-scale, realizing the preparation of stable p-type or n-type nanowire regions, which can be converted between the p-type and the n-type through one polarization reversal. The above-described preparation method and charge carrier type converting method are simple and easy to implement, have high reproducibility, and can be massively reproduced and implemented. The formed nanowire region has the width of several tens of nanometers, and the electrical conductivity is close to that of a semiconductor. The lithium niobate having the p-type or n-type nanowire region can be used as an electrical device, applied in the fields of the preparation of nanoscale printed circuits and p-n junctions, thus is beneficial to the development of an integrated optoelectronic device based on lithium niobate.

Example 1

The pristine lithium niobate crystal was a z-cut congruent lithium niobate crystal with a magnesium doping concentration of 5 mol %. The crystal size was x×y×z=8 mm×8 mm×0.5 mm. The pristine single-domain lithium niobate crystal had been made into a periodically poled ferroelectric domain structure.

The periodically poled lithium niobate crystal was placed in a heating furnace for the heat treatment. The experimental apparatus is shown in FIG. 3. The heating rate was 5° C./min, the temperature was held at 120° C. for 2 hours, and the cooling rate was 5° C./min, respectively.

After the lithium niobate crystal was cooled down to room temperature, the crystal was subjected to the polarization reversal using liquid electrodes, as shown in FIG. 4. In this case, the positive electrode of the high-voltage power source 23 was connected to the −z surface of the pristine crystal, and the negative electrode of the high-voltage power source 23 was connected to the +z surface of the pristine crystal. In the poling process, a voltage pulse was adopted, and the waveform of the applied voltage pulse is shown in FIG. 5. The voltage pulse peak was 2.8 kV, and the effective time duration of the voltage pulse was 100 ms. A series of voltage pulses were applied until the polarization reversal in the crystal was completed. After the polarization reversal, the polarization direction of the bulk domain in the crystal was consistent with the c-axis of the pristine crystal.

Figure 9:
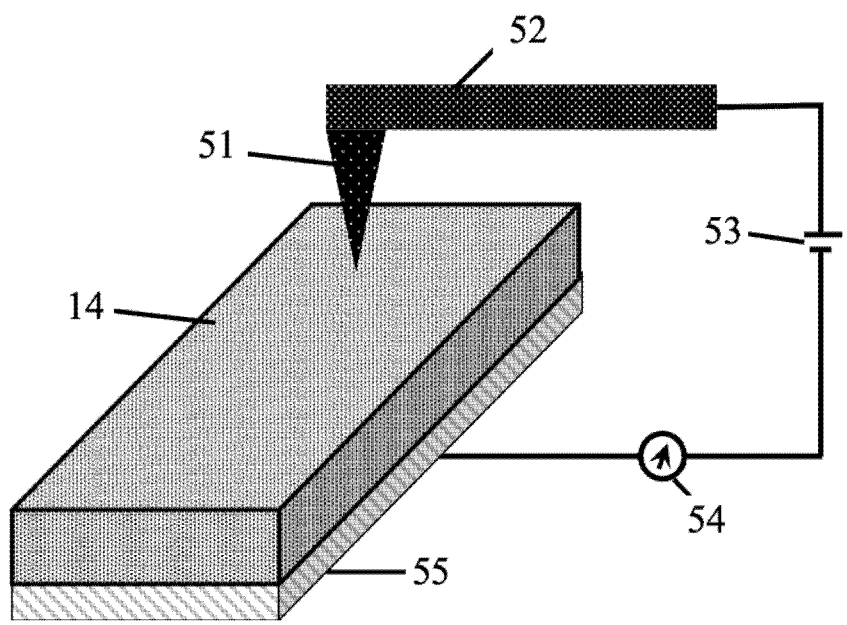
FIG. 9 is a schematic view of a setup connection in testing a prepared nanowire region by a piezoresponse force microscope (PFM) according to an embodiment of the present application.

The lithium niobate crystal prepared above was subjected to a PFM test using an MFP-3D atomic force microscope manufactured by Oxford Instruments. Referring to FIG. 9, an electrode 55 was formed by coating conductive silver paste on one surface of the lithium niobate crystal 14. A metal probe 51 was clamped by a probe holder 52, and a probe needle tip thereof was opposite to a surface of the lithium niobate crystal 14 away from the electrode 55. The probe holder 52 was electrically connected to a positive electrode of a power source 53 of the PFM. A negative electrode of the power source 53 was electrically connected to a signal detection device 54 and the electrode 55 in series. The metal probe 51 detected the local piezoelectric signals on the surface of the lithium niobate crystal 14 by scanning through the surface of the lithium niobate crystal 14, giving a domain structure distribution of the surface of the lithium niobate crystal 14, and therefore characterizing the prepared nanowire structures.

Figure 10A:
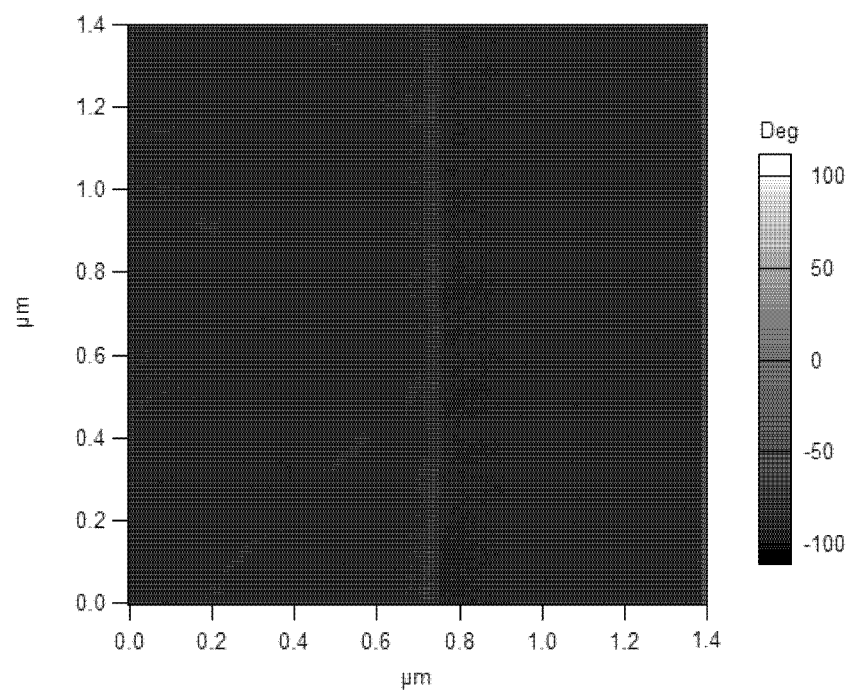
FIG. 10A is a PFM phase diagram of a lithium niobate crystal having a p-type nanowire region prepared in an embodiment of the present application.
Figure 10B:
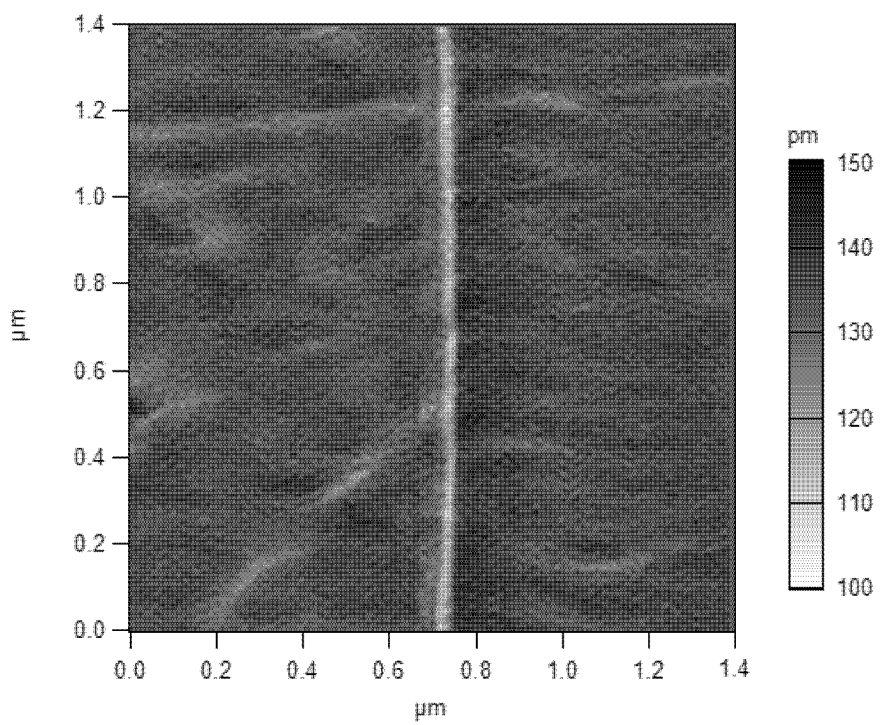
FIG. 10B is a PFM amplitude diagram of a lithium niobate crystal having a p-type nanowire region prepared in an embodiment of the present application.

The experimental results are shown in FIG. 10A and FIG. 10B, which are respectively the phase and amplitude diagrams of the nanowires on the −z surface of the lithium niobate crystal. It can be seen from the phase diagram (FIG. 10A) that there was a one-dimensional structure with phase signals different from other regions in the crystal, and a traverse width of the structure was about 40 nm. Moreover, it can be seen from the amplitude diagram (FIG. 10B) that the amplitude signal of the one-dimensional structure was relatively low. According to the working principle of the PFM technique, the phase and amplitude signals of PFM reflect the polarization magnitude of the domain structure in the ferroelectric material. The magnitude of the amplitude signal reflects the strength of the ferroelectric material's piezoelectric tensor, and the PFM phase signal further provides the information of polarization direction. The relatively low amplitude of the one-dimensional structure indicated that the polarization magnitude of the one-dimensional structure was relatively small. This result proved the correctness of our method; that is, a nanowire structure with a special domain structure can be prepared. The polarization vector distribution of the nanowire structure and the bulk domain is shown in FIG. 7A. According to Gauss's law, negative net bound charges existed at the interface between the nanowire and the bulk domain. At this position, there were positive compensating charges (free holes) with the same amount but an opposite polarity from the net bound charges to achieve charge equilibrium due to the requirement of electrical neutrality in the crystal. Therefore, the p-type nanowire region was obtained by the present method.

Figure 11A:
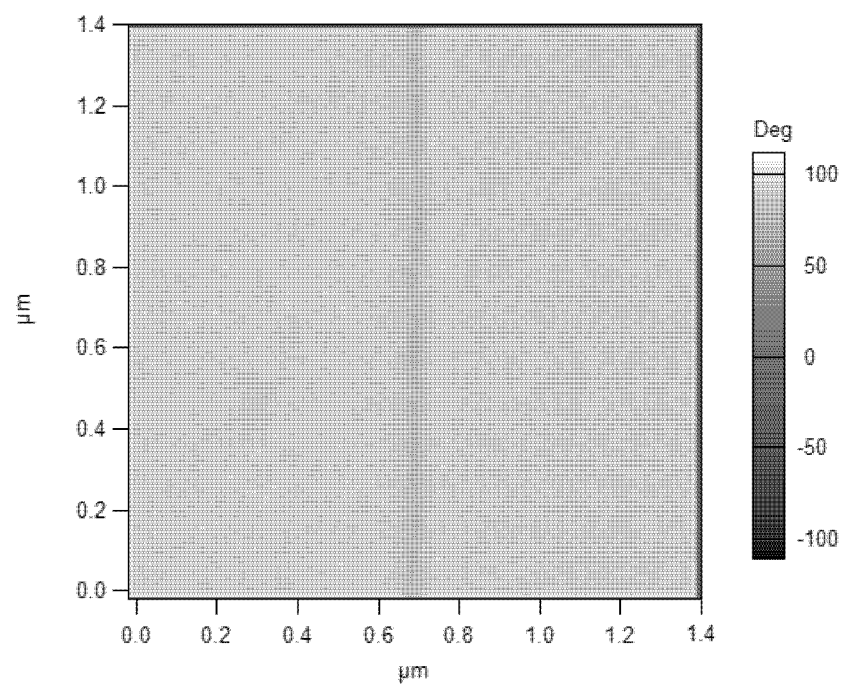
FIG. 11A is a PFM phase diagram of a lithium niobate crystal having an n-type nanowire region prepared in an embodiment of the present application.
Figure 11B:
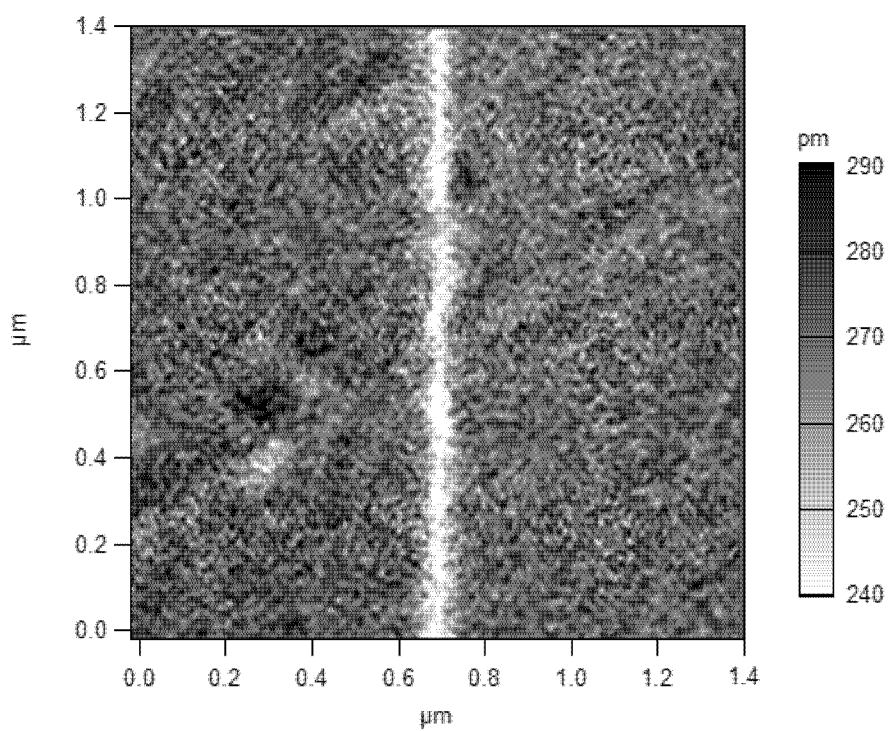
FIG. 11B is a PFM amplitude diagram of a lithium niobate crystal having an n-type nanowire region prepared in an embodiment of the present application.

In order to convert the charge carrier type of the nanowire, the crystal underwent the polarization reversal for the second time. In the polarization reversal, the positive electrode of the high-voltage power source was connected to the +z surface of the crystal, and the negative electrode of the high-voltage power source was connected to the −z surface of the crystal. The polarization poling apparatus is shown in FIG. 4. The poling process was the same as that in the last time, and will not be repeated herein. The PFM phase and amplitude diagrams of the nanowire region are shown in FIG. 11A and FIG. 11B. From the PFM test results, it can be concluded that the charge carrier type of the nanowire region was converted to the n-type.

Figure 12:
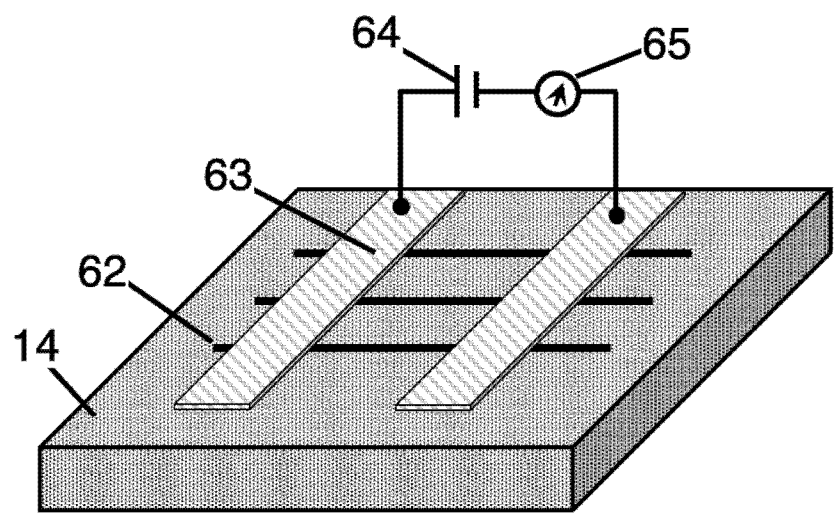
FIG. 12 is a schematic view of a setup connection in testing characteristics of electrical conductance of a prepared nanowire region according to an embodiment of the present application.

In order to further understand the electrical conductance characteristics of the nanowire regions, electrical characterization of the nanowire regions was further obtained with the measurement setup shown in FIG. 12. Two stripe-shaped conducting electrodes 63 were deposited on the surface of the lithium niobate crystal 14 by using the photolithography technique. The longer edges of the electrodes 63 were perpendicular to the longitudinal direction of the nanowire region 62. An electrical voltage was applied between the two electrodes 63 through a voltage source 64, and the electrical conductance characteristics of the nanowire regions 62 were measured through a current measuring device 65. In the measurement, in order to make the contact between the electrode 63 and the lithium niobate crystal 14 an ohmic contact, chromium (Cr) metal electrodes were used as the metal electrodes 63, and the thickness of the electrodes was 500 nm. In order to obtain a relatively large current, a distance between the two electrodes 63 was 5 μm. The electrodes 63 were formed on the −z surface of the crystal. The current measuring device was a Keithley 6517A electrometer with a measurement accuracy of 0.01 pA. The steady-state I-V curves and the characteristic current decay curves of the nanowire region are respectively shown in FIG. 13A and FIG. 13B.

Figure 13A:
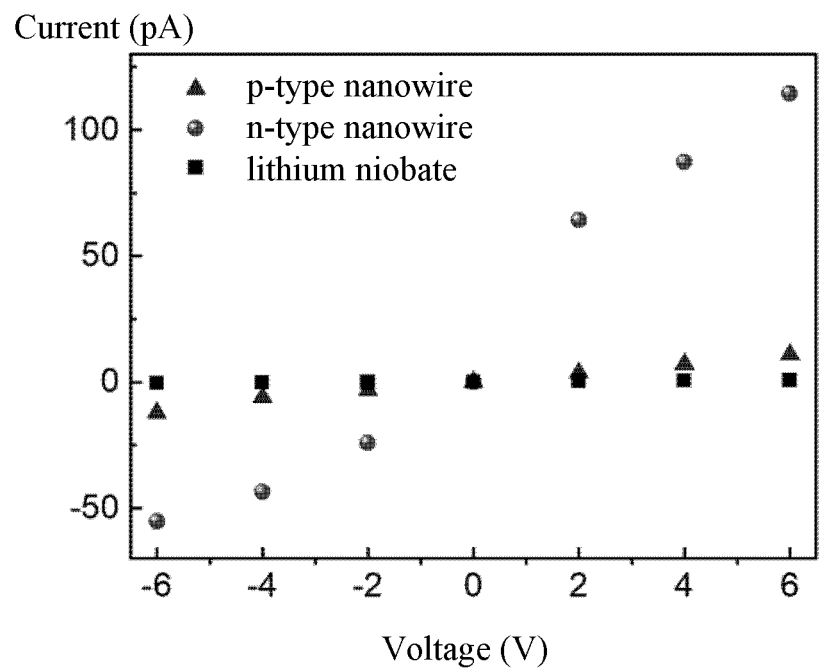

For comparison, FIG. 13A also shows the I-V curve of the pristine single-domain lithium niobate crystal. The electrical conductivity of the pristine magnesium-doped lithium niobate crystal without the nanowire region was $10^{-12}$ $(\Omega cm)^{-1}$. As the width of the nanowire was about 40 nm, it can be estimated that the electrical conductivity of the n-type nanowire structure was larger than $10^{-6}$ $(\Omega cm)^{-1}$, and the electrical conductivity of the p-type nanowire structure was larger than $10^{-7}$ $(\Omega cm)^{-1}$, which had been respectively increased by 6 orders of magnitude and 5 orders of magnitude as compared to the conductivity of the pristine lithium niobate crystal.

Figure 13B:
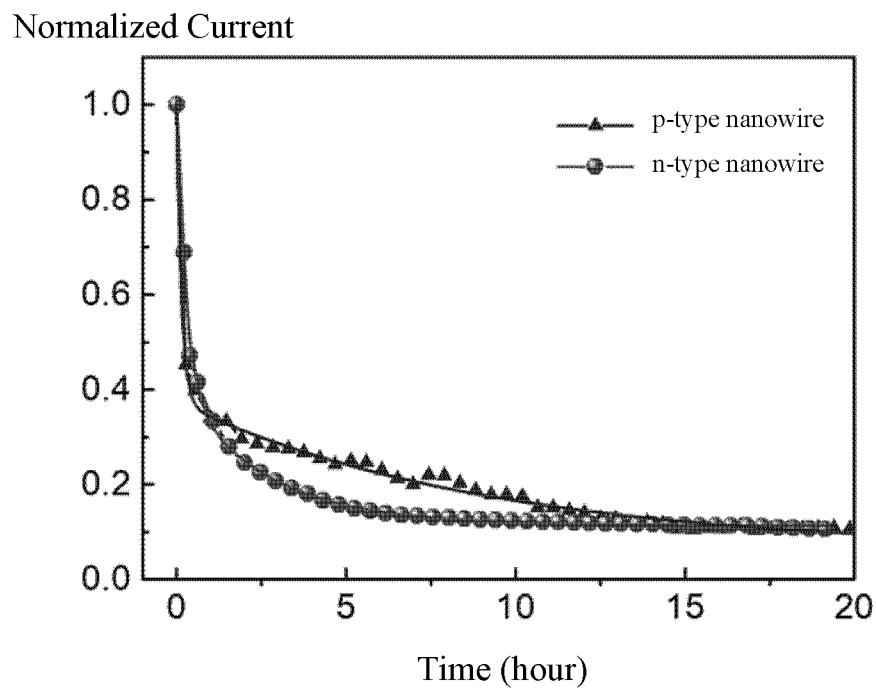

It can be seen from the electrical decay characteristics of FIG. 13B that both the p-type and the n-type nanowire structures exhibited similar electrical decay characteristics. It can be found from the fitting curves that the decay dynamics of the p-type and the n-type nanowire structures followed a bi-exponential decay, indicating that there exist a fast process and a slow process in the electrical decay processes of the p-type and n-type nanowire structures. The conductivities of both two types of nanowire regions were finally stable at about 10% of the initial conductivity, and were still relatively large.

In the present application, lithium niobate nanostructures with controllable charge carrier types can be prepared, thus appropriate active devices based on lithium niobate can be prepared, which could lead to the realization of the integration of $LiNbO_3$-based active-passive optoelectronic devices, greatly broadening the application of lithium niobate in the fields of photoelectric conversion and optoelectronic integration.

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the present application.

The above-described embodiments are only several implementations of the present application, and the descriptions are relatively specific and detailed, but they should not be construed as limiting the scope of the present application. It should be understood by those of ordinary skill in the art that various modifications and improvements can be made without departing from the concept of the present application, and all fall within the protection scope of the present application. Therefore, the patent protection of the present application shall be defined by the appended claims.

What is claimed is:

1. A method for preparing a lithium niobate crystal having a p-type nanowire region or an n-type nanowire region, comprising:
   heating and then cooling a multi-domain lithium niobate crystal to confine hydrogen ions in domain wall regions of the multi-domain lithium niobate crystal; and
   poling the multi-domain lithium niobate crystal by applying a voltage to the multi-domain lithium niobate crystal that has been heated to reverse the polarization direction of one or more domains of the multi-domain lithium niobate crystal, thereby forming the p-type nanowire region or the n-type nanowire region,
   wherein the p-type nanowire region and the n-type nanowire region are formed simultaneously in the lithium niobate crystal by applying the poling voltage for one time.

2. The method of claim 1, wherein on a condition that a positive electrode of an external power source configured to supply the poling voltage is electrically connected to a first surface of the multi-domain lithium niobate crystal, a negative electrode of the external power source is electrically connected to a second surface of the multi-domain lithium niobate crystal, and the first surface is opposite to the second surface, the p-type nanowire region is formed at a location adjacent to the first surface and the n-type nanowire region is formed at a location adjacent to the second surface by applying the poling voltage.

3. The method of claim 1, wherein on a condition that a positive electrode of an external power source configured to supply the poling voltage is electrically connected to a second surface of the multi-domain lithium niobate crystal, a negative electrode of the external power source is electrically connected to a first surface of the multi-domain lithium niobate crystal, and the first surface is opposite to the second surface, the n-type nanowire region is formed at a location adjacent to the first surface and the p-type nanowire region is formed at a location adjacent to the second surface by applying the poling voltage.

4. The method of claim 1, wherein the multi-domain lithium niobate crystal is a z-cut lithium niobate crystal.

5. The method of claim 1, wherein a concentration of hydrogen ions in the multi-domain lithium niobate crystal is larger than or equal to $10^{18}$ cm$^{-3}$.

6. The method according to claim 1, wherein in the heating and the cooling, a heating rate is smaller than or equal to 5° C./min, and a cooling rate is smaller than or equal to 5° C./min.

7. The method according to claim 1, wherein a temperature of the heating is in a range from 90° C. to 180° C., at which a holding time duration is in a range from 0.5 hours to 2 hours.

8. The method of claim 1, wherein the heating is performed immediately after the multi-domain structure of the lithium niobate crystal is formed.

9. The method of claim 1, wherein the poling is performed after the temperature of the multi-domain lithium niobate is cooled down to room temperature after the heating.

10. The method of claim 1, wherein the applied voltage is a pulsed voltage.

11. The method of claim 1, wherein the voltage is greater than or equal to the polarization reversal voltage of the lithium niobate crystal and smaller than a breakdown voltage of the lithium niobate crystal.

12. The method of claim 1, wherein the applying the voltage comprises applying electric fields in opposite directions onto different positions on a same surface of the multi-domain lithium niobate crystal, so that the domains in the different positions undergo polarization reversals in opposite directions, which correspondingly and simultaneously form the p-type nanowire region and the n-type nanowire region adjacent to the same surface of the lithium niobate crystal.

13. A lithium niobate crystal having a p-type nanowire region or an n-type nanowire region, wherein the p-type nanowire region or the n-type nanowire region is located in the lithium niobate crystal and adjacent to a surface of the lithium niobate crystal, and the p-type nanowire region and the n-type nanowire region are respectively adjacent to two opposite surfaces of the lithium niobate crystal, or are both adjacent to a same surface of the lithium niobate crystal.

14. The lithium niobate crystal of claim 13, wherein a traverse size of the nanowire region is in a range from 40 nanometers to 100 nanometers; a longitudinal depth of the nanowire region is in a range from 1 micron to 5 microns.

15. The lithium niobate crystal of claim 13, wherein an electrical conductivity of the p-type nanowire region is on the order of $10^{-7}$ ($\Omega$ cm)$^{-1}$, and an electrical conductivity of the n-type nanowire region is on the order of $10^{-6}$ ($\Omega$ cm)$^{-1}$.

16. The lithium niobate crystal of claim 13, wherein the lithium niobate crystal is a z-cut lithium niobate crystal having a thickness less than 1 millimeter.

17. A method for converting a charge carrier type of a nanowire region of a lithium niobate crystal, comprising:
   re-poling the lithium niobate crystal prepared by the method of claim 1 by applying another voltage to the lithium niobate crystal to reverse a direction of polarization of the nanowire region, thereby converting the charge carrier type of the nanowire region.

18. The method of claim 17, wherein a direction of an external electric field in the re-poling is opposite to the direction of polarization of the nanowire region.

* * * * *